(12) United States Patent
Lee

(10) Patent No.: US 6,466,060 B2
(45) Date of Patent: Oct. 15, 2002

(54) SWITCHING DEVICE WITH SEPARATED DRIVING SIGNAL INPUT AND DRIVING CIRCUIT OF THE SAME

(75) Inventor: Dong-Cheol Lee, Incheon (KR)

(73) Assignee: Fairchild Korea Semiconductor Ltd., Bucheon (KR)

(*) Notice: Subject to any disclaimer, the term of this patent is extended or adjusted under 35 U.S.C. 154(b) by 0 days.

(21) Appl. No.: 09/844,173

(22) Filed: Apr. 25, 2001

(65) Prior Publication Data

US 2001/0040480 A1 Nov. 15, 2001

(30) Foreign Application Priority Data

Apr. 26, 2000 (KR) .......................... 2000-22219

(51) Int. Cl.[7] .................................. H03K 3/00
(52) U.S. Cl. ............................ 327/108; 327/434
(58) Field of Search ...................... 327/108–112, 434, 327/436, 437, 563

(56) References Cited

U.S. PATENT DOCUMENTS 5,570,057 A * 10/1996 Palara ........................ 327/108
5,610,538 A *  3/1997 Kim .......................... 327/170
5,631,588 A *  5/1997 Bertolini .................... 327/108

* cited by examiner

*Primary Examiner*—Kenneth B. Wells
(74) *Attorney, Agent, or Firm*—Alston & Bird LLP

(57) ABSTRACT

An input-separated switching device driving circuit in an equivalent power source for supplying a source current, the input-separated switching device driving circuit including: an input-separated switching device which includes a main switching device for switching a load current portion of the source current based on a first driving signal applied to a first driving signal input, and a sense switching device for switching another portion of the source current based on a second driving signal applied to a second driving signal input in order to check the intensity of the load current.

11 Claims, 4 Drawing Sheets

SWITCHING DEVICE WITH SEPARATED DRIVING SIGNAL INPUT AND DRIVING CIRCUIT OF THE SAME

BACKGROUND OF THE INVENTION (a) Field of the Invention

The present invention relates to a MOS FET (metal oxide semiconductor field effect transistor) driving circuit. More specifically, the present invention relates to a MOS FET with a main FET and a sense FET, and a driving circuit of the same.

(b) Description of the Related Art

In general, a current is allowed to flow through a MOS FET when an electrical field is applied to a gate of the MOS FET to form a channel between the drain and the source of the MOS FET. The MOS FET can be switched on/off by controlling the intensity of the electric field applied to the gate of the MOS FET.

To switch the MOS FET on/off, a MOS FET driving circuit for controlling the voltage applied to the gate of the MOS FET and a sense FET for detecting the intensity of the current flowing to the MOS FET are required.

FIG. 1 is a circuit diagram of a conventional MOS FET driving circuit.

As shown in FIG. 1, the conventional MOS FET driving circuit senses load current $I_L$ through a current sensing resistor $R_S$ and thereby controls the drive of the MOS FET. This driving circuit is relatively simplified in construction such that upon a rapid increase in the load current $I_L$, under excessive conditions, the voltage applied to the current sensing resistor $R_S$ is raised and the voltage $V_{gs}$ between the gate and the source of the MOS FET is reduced. The effect is an increase in resistance $R_{ds}$ between the drain and the source of the switched on MOS FET, which limits the load current and prevents a breakdown of the MOS FET.

FIG. 2 is a circuit diagram of another conventional MOS FET driving circuit.

As shown in FIG. 2, in another example of the conventional MOS FET driving circuit, the drain of a main FET is connected to that of a sense FET and the gate of the main FET is connected to that of the sense FET. The source of the sense FET is connected to current sensing resistor $R_S$. The main FET and the sense FET are contained in a single chip and are similar to each other in characteristics. But, a current ratio is set such that almost all the current flows towards the main FET to reduce energy consumption at the current sensing resistor.

However, the conventional MOS FET driving circuit shown in FIG. 2 increases a voltage applied to the current sensing resistor $R_S$ as the load current $I_L$ rises so that the ratio of the current $I_{main}$ flowing to the main FET and the current $I_{sense}$ flowing to the sense FET becomes incorrect. Upon a rapid increase in the load current $I_L$, under excessive conditions, the circuit raises the voltage applied to the current sensing resistor $R_S$ and thereby lowers the voltages $V_{gs}$ and $V_{sense}$ of the sense FET but not the voltages $V_{gs}$ and $V_{main}$ of the main FET, thus inevitably incurring a breakdown of the main FET.

SUMMARY OF THE INVENTION

It is an object of the present invention to solve the above problems and to provide an input-separated switching device that has a sense FET so as to control the current accurately and prevent a breakdown of the MOS FET, and a driving circuit of the same.

To achieve the solution to the problems with the prior art, the MOS FET and the MOS FET driving circuit according to the present invention include a main FET and a sense FET, in which the drain of the main FET is connected to the drain of the sense FET and the gate of the main FET is separated from the gate of the sense FET.

In one aspect of the present invention, there is provided an input-separated switching device including: a main switching device for switching a load current portion of the source current based on a first driving signal applied to a first driving signal input; and a sense switching device for switching another portion of the source current based on a second driving signal applied to a second driving signal input in order to check the intensity of the load current.

The main switching device and the sense switching device are a main FET and a sense FET, respectively, wherein a drain of the main FET is connected to a drain of the sense FET, and wherein a gate and a source of the main FET are separated from a gate and a source of the sense FET, respectively.

In another aspect of the present invention, an input-separated switching device driving circuit includes an input-separated switching device, a current sensor, and a current ratio compensator.

The input-separated switching device includes a main switching device for switching a load current portion of the source current based on a first driving signal applied to a first driving signal input, and a sense switching device for switching another portion of the source current based on a second driving signal applied to a second driving signal input in order to check the intensity of the load current.

The current sensor forms a sensing voltage to check the intensity of the load current using current flowing to the sense switching device, the current sensor having one terminal thereof connected to the current output of the sense switching device.

The current ratio compensator applies the sensing voltage to the second driving signal input. The current ratio compensator has a first terminal connected to one terminal of the current sensor, and a second terminal connected to the second driving signal input.

In still another aspect of the present invention, an input-separated switching device driving circuit includes an input-separated switching device, a current sensor, and a current ratio compensator.

The input-separated switching device includes a main switching device for switching a load current portion of the source current based on a first driving signal applied to a first driving signal input, and a sense switching device for switching another portion of the source current based on a second driving signal applied to a second driving signal input in order to check the intensity of the load current.

The current sensor forms a sensing voltage to check intensity of the load current using current flowing to the sense switching device, the current sensor having one terminal thereof connected to a current output of the sense switching device.

The current ratio compensator reduces a voltage applied to the first driving signal input by way of the sensing voltage, the current ratio compensator having a first terminal connected to one terminal of the current sensor, and a second terminal connected to the first driving signal input.

In still another aspect of the present invention, an input-separated switching device driving circuit includes an input-separated switching device, a first delay circuit, a main switch driver, a second delay circuit, a sense switch driver, and a current sensor.

The input-separated switching device includes a main switching device for switching a load current portion of a source current, and a sense switching device for switching another portion of the source current in order to check intensity of the load current.

The first delay circuit receives the second control signal to delay a time, and outputs a delayed second control signal.

The main switch driver switches on the main switching device based on the first control signal, and switches off the main switching device with a delay based on the second control signal output from the first delay circuit.

The second delay circuit receives the first control signal to delay a time, and outputs a delayed first control signal;

The sense switch driver switches on the sense switching device with a delay based on the first control signal output from the second delay circuit, and switches off the sense switching device based on the second control signal.

The current sensor forms a sensing voltage to check the intensity of the load current using current flowing to the sense switching device, the current sensor having one terminal thereof connected to a current output of the sense switching device.

The main switching device and the sense switching device are a main FET and a sense FET, respectively, wherein a drain of the main FET is connected to a drain of the sense FET, and wherein a gate and a source of the main FET are separated from a gate and a source of the sense FET, respectively.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Hereinafter, a description will be given as to a MOS FET with a sense FET, and a driving circuit for the MOS FET according to the present invention with reference to the accompanying drawings.

Figure 3:
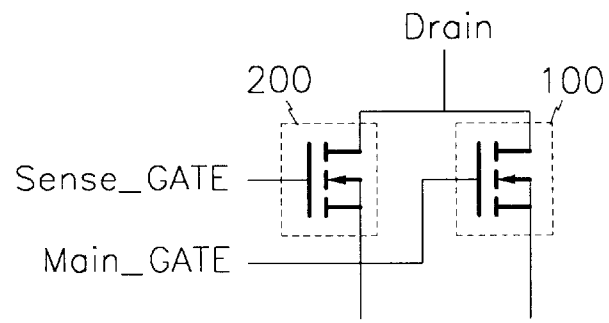
FIG. 3 is a circuit diagram of an input-separated switching device according to an embodiment of the present invention.

FIG. 3 is a circuit diagram of an input-separated switching device according to an embodiment of the present invention.

As shown in FIG. 3, the input-separated switching device according to the embodiment of the present invention includes a main FET 100 for switching a load current based on a driving signal, and a sense FET 200 for forming a feedback signal based on a second driving signal.

The drain of the main FET 100 is connected to the drain of the sense FET 200, and the gate and the source of the main FET 100 are separated from the gate and the source of the sense FET 200, respectively. The main FET 100 and the sense FET 200 are contained in a single chip and have the same characteristics. The MOS FET according to the embodiment of the present invention has five terminals in total, i.e., one drain, two sources and two gates.

Figure 4:
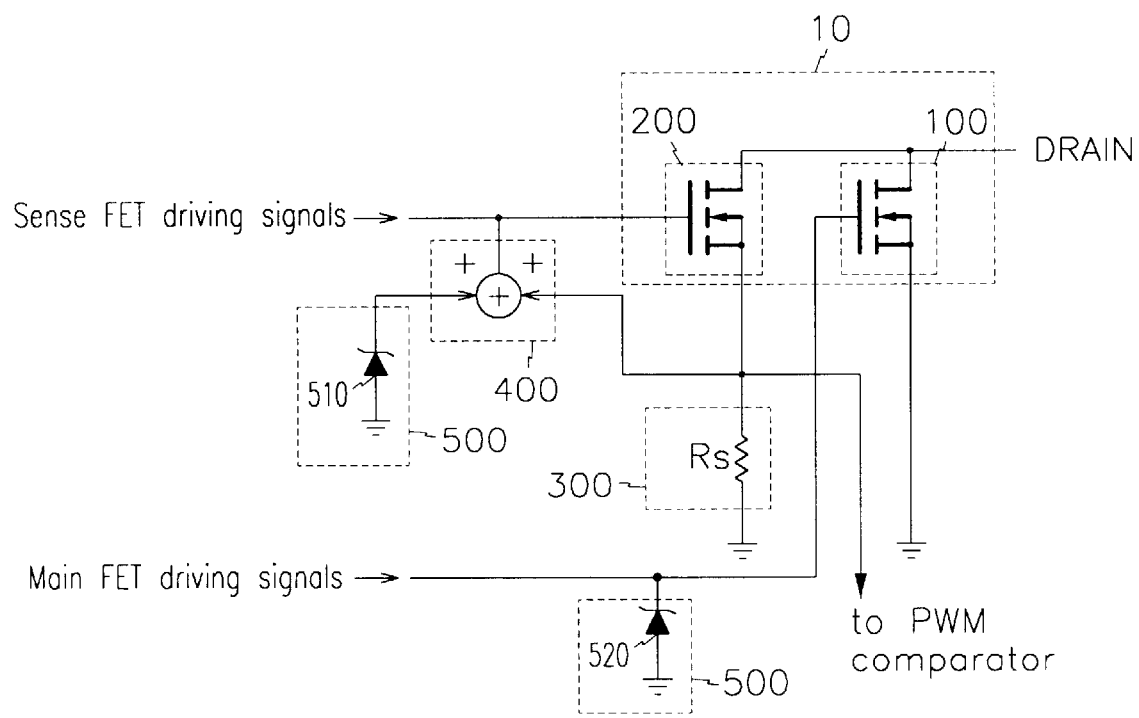
FIG. 4 is a circuit diagram of a switching device driving circuit according to a first embodiment of the present invention.

FIG. 4 is a circuit diagram of a switching device driving circuit according to a first embodiment of the present invention.

As shown in FIG. 4, the switching device driving circuit according to the first embodiment of the present invention includes an input-separated switching device 10, a current sensor 300, a current ratio compensator 400, and a switching device protector 500.

The input-separated switching device 10 includes a main FET 100 and a sense FET 200, in which the drain of the main FET 100 is connected to the drain of the sense FET 200, and the gate and the source of the main FET 100 are separated from the gate and the source of the sense FET 200, respectively.

The current sensor 300 is to sense the intensity of the current flowing to the input-separated switching device 10 and is connected to the source of the sense FET 200. The current sensor 300 according to the first embodiment of the present invention uses a resistor $R_S$ in sensing the current, with one terminal of the resistor $R_S$ connected to the source of the sense FET 200 and the other terminal being grounded.

The current ratio compensator 400 is to compensate for the incorrectness of the ratio of the current flowing to the main FET 100, and the current flowing to the sense FET 200 that occurs when a voltage formed at the current sensor 300 by the current flowing to the current sensor 300 reduces the voltage applied between the gate and the source of the sense FET 200. The current ratio compensator 400 according to the first embodiment of the present invention uses an adder, which has a first terminal connected to one terminal of the current sensor 300, and a second terminal connected to the gate of the sense FET 200.

Figure 1:
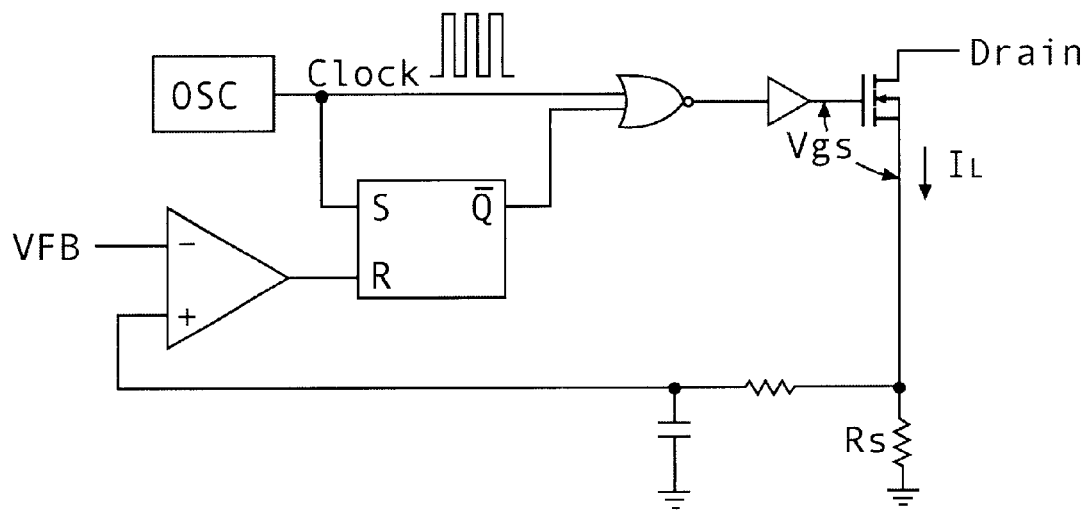
FIG. 1 is a circuit diagram of a conventional MOS FET driving circuit, in accordance with the prior art.
Figure 2:
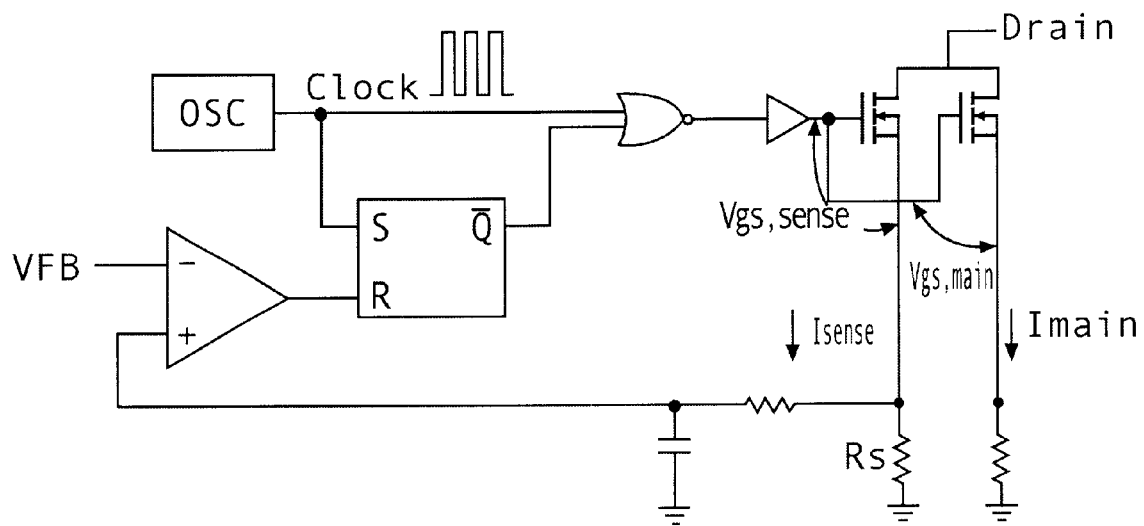
FIG. 2 is a circuit diagram of another conventional MOS FET driving circuit, in accordance with the prior art.

The MOS FET driving circuit shown in FIG. 2 has an incorrect current ratio when an increase in the intensity of the current flowing to the sense FET 200 raises a voltage applied to the current sensing resistor $R_S$ and thereby reduces a voltage between the gate and the source of the sense FET 200. Contrarily, the driving circuit of the input-separated switching device 10 according to the embodiment of the present invention, upon an increase in the intensity of the current flowing to the sense FET 200, causes the current ratio compensator 400 to apply a voltage to the gate of the sense FET 200. The voltage applied to the gate of the sense FET 200 by the current ratio compensator 400 will be as high as the voltage applied to the current sensor 300 and will thereby maintain the voltage between the gate and the source of the sense FET 200 in spite of an increase in the voltage applied to the current sensor 300.

The switching device protector 500 is to prevent a breakdown of the main FET 100 and the sense FET 200 caused by an excessive current flowing to the gates of the main FET 100 and the sense FET 200. The switching device protector 500 senses the excessive current flowing to the gates of the main FET 100 and the sense FET 200 and sinks input signals of the gates of the main FET 100 and the sense FET 200. The switching device protector 500 according to the first embodiment of the present invention uses first and second Zener diodes 510 and 520, in which the second Zener diode 520 has a cathode connected to the gate of the main FET 100 and an anode being grounded, and the first Zener diode 510 has a cathode connected to a third terminal of the current ratio compensator 400 and an anode being grounded.

Now, a description will be given in detail as to the operation of the switching device driving circuit according to the first embodiment of the present invention with reference to FIG. 4.

The MOS FET driver outputs a driving signal to the gates of the main FET 100 and the sense FET 200 to drive the main FET 100 and the sense FET 200. As the main FET 100 and the sense FET 200 are driven, the current flows between the drain and the source of the main FET 100 and of the sense FET 200.

The resistor $R_S$ of the current sensor 300 detects the current flowing to the sense FET 200 to form a sensing voltage. This sensing voltage is applied to the current ratio compensator 400 that in turn applies the sensing voltage to the is gate of the sense FET 200. The sensing voltage is applied to the gate of the sense FET 200 so as to maintain the voltage between the gate and the source of the sense FET 200 even with an increase in the sensing voltage, thereby maintaining the ratio of the current flowing to the sense FET 200 to the current flowing to the main FET 100.

When an excessive voltage is applied to the gates of the main FET 100 and the sense FET 200 due to a factor, the first and second Zener diodes 510 and 520 of the switching device protector 500 are switched on to sink the signals applied to the gates of the main FET 100 and the sense FET 200.

Now, the second embodiment of the present invention will be described in detail with reference to the accompanying drawings.

Figure 5:
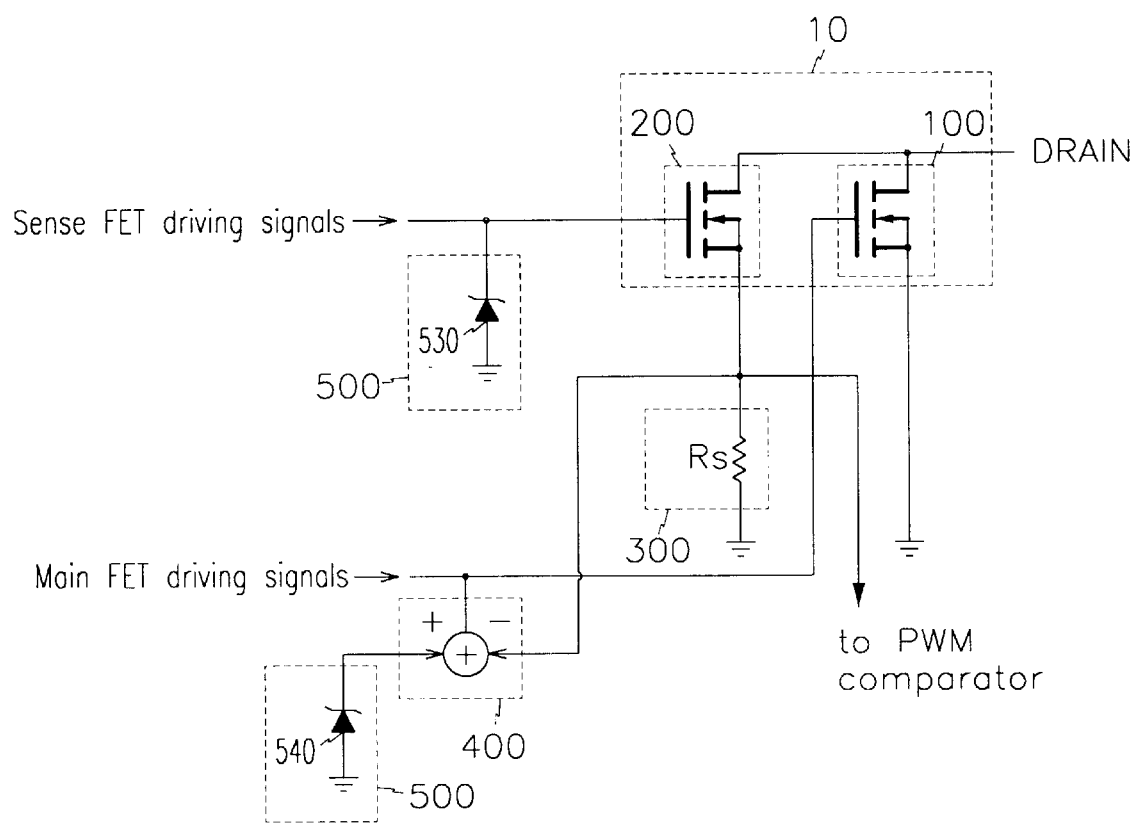
FIG. 5 is a circuit diagram of a switching device driving circuit according to a second embodiment of the present invention.

FIG. 5 is a circuit diagram of a switching device driving circuit according to a second embodiment of the present invention.

As shown in FIG. 5, the switching device driving circuit according to the second embodiment of the present invention includes an input-separated switching device 10, a current sensor 300, a current ratio compensator 400, and a switching device protector 500.

The input-separated switching device 100 and the current sensor 300 are the same as described in the first embodiment and will not be further described herein.

The current ratio compensator 400 is to compensate for the incorrectness of the ratio of the current flowing to the main FET 100 to that of the current flowing to the sense FET 200 that occurs when a voltage formed at the current sensor 300 by the current flowing to the current sensor 300 reduces a voltage between the gate and the source of the sense FET 200. The current ratio compensator 400 according to the second embodiment of the present invention uses an adder that has a first terminal connected to one terminal of the current sensor 300 and a second terminal connected to the gate of the main FET 100.

Accordingly, when an increase in the intensity of the current flowing to the sense FET 200 raises a voltage applied to the current sensor 300 and reduces a voltage between the gate and the source of the sense FET 200, the current ratio compensator 400 reduces the voltage between the gate and the source of the main FET 100. The voltage is reduced by the decrement of the voltage between the gate and the source of the sense FET 200 so as to maintain the ratio of the current flowing to the main FET 100 with that of the current flowing to the sense FET 200. In addition, the current ratio compensator 400 also reduces the voltage between the gate and the source of the main FET 100 by the sensing voltage in order to protect the main FET 100.

The switching device protector 500 is to prevent a breakdown of the main FET 100 and the sense FET 200 caused by an excessive current flowing to the gates of the main FET 100 and the sense FET 200. The switching device protector 500 senses the excessive current flowing to the gates of the main FET 100 and the sense FET 200 and sinks input signals of the gates of the main FET 100 and the sense FET 200.

The switching device protector 500 according to the second embodiment of the present invention uses third and fourth Zener diodes 530 and 540, in which the fourth Zener diode 540 has a cathode connected to the third terminal of the current ratio compensator 400 and an anode being grounded, and the third Zener diode 530 has a cathode connected to the gate of the sense FET 200 and an anode being grounded.

Now, a description will be given in detail as to the operation of the switching device driving circuit according to the second embodiment of the present invention with reference to FIG. 5.

The MOS FET driver outputs a driving signal to the gates of the main FET 100 and the sense FET 200 to drive the main FET 100 and the sense FET 200. As the main FET 100 and the sense FET 200 are driven, the current flows to the main FET 100 and the sense FET 200.

The resistor $R_S$ of the current sensor 300 detects the current flowing to the sense FET 200 to form a sensing voltage. This sensing voltage is applied to the current ratio compensator 400 that in turn reduces the voltage applied to the gate of the main FET 100 by the sensing voltage to increase the sensing voltage and reduces the voltage between the gate and the source of the main FET 100 by as much as the reduced voltage between the gate and the source of the sense FET 200, thus maintaining the ratio of the current flowing to the main FET 100 with that of the current flowing to the sense FET 200.

The current ratio compensator 400 according to the second embodiment of the present invention reduces the voltage applied to the gate of the main FET 100 by way of the sensing voltage to prevent a breakdown of the main FET 100 that may otherwise occur due to an excessive voltage.

When an excessive voltage is applied to the gates of the main FET 100 and the sense FET 200 due to a factor during the operation of the switching device driving circuit, the third and fourth Zener diodes 530 and 540 of the switching device protector 500 are switched on to sink the signals applied to the gates of the main FET 100 and the sense FET 200 and thereby protect the main FET 100 and the sense FET 200.

As described above, the driving circuit controls the main FET 100 and the sense FET 200 separately using a five-terminal MOS FET to maintain the ratio of the current flowing to the main FET 100 to the current flowing to the sense FET 200.

Figure 6:
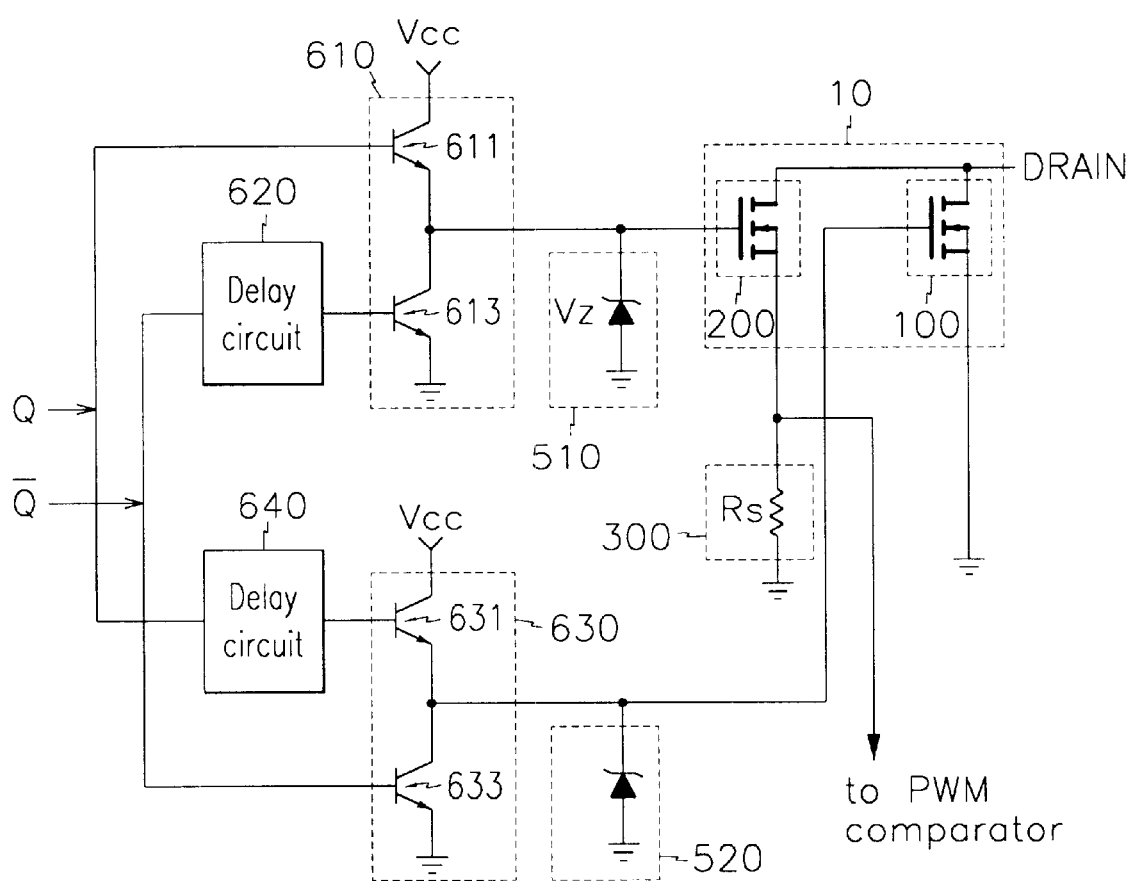
FIG. 6 is a circuit diagram of a switching device driving circuit according to a third embodiment of the present invention.

FIG. 6 is a circuit diagram of a switching device driving circuit according to a third embodiment of the present invention.

As shown in FIG. 6, the switching device driving circuit according to the third embodiment of the present invention includes an input-separated switching device 10, a current sensor 300, a first switching device protector 510, a second switching device protector 520, a sense FET driver 610, a first delay circuit 620, a main FET driver 630, and a second delay circuit 640.

The input-separated switching device 10, the current sensor 300, and the first and second switching device protectors 510 and 520 are the same as described in the first embodiment and will not be further described herein. Unlike the first and second embodiments, the cathodes of the first and second switching device protectors 510 and 520 are connected to the gates of the sense FET 200 and the main FET 100, respectively, to protect the main FET 100 and the sense FET 200 when an excessive voltage is applied to the gates of the main FET 100 and the sense FET 200.

The sense FET driver 610 outputs an on/off signal of the sense FET 200 based on first and second control signals Q and $\overline{Q}$, which are opposite to each other in truth value. The sense FET driver 610 is composed of two bipolar junction transistors (BJT), i.e., first and second switches 611 and 613, in which the first switch 611 has a collector connected to power source $V_{CC}$, a base connected to the first control signal Q, and an emitter connected to the collector of the second switch 613.

The first delay circuit 620 delays the second control signal $\overline{Q}$ and outputs the delayed second control signal to the base of the second switch 613.

The main FET driver 630 outputs an on/off signal of the main FET 100 based on the first and second control signals Q and $\overline{Q}$. The main FET driver 630 is composed of two BJT's, i.e., third and fourth switches 631 and 633, in which the collector of the third switch 631 is connected to a power source $V_{CC}$, the collector of the fourth switch 633 is connected to the emitter of the third switch 631, and the base of the fourth switch 633 is connected to the input of the second control signal $\overline{Q}$.

The second delay circuit 640 delays the first control signal Q and outputs the delayed first control signal to the base of the third switch 631.

As described above, the third embodiment of the present invention has the gate of the main FET 100 separated from the gate of the sense FET 200 so that the main FET 100 and the sense FET 200 can be switched on/off with a delay as set by the designer. The third embodiment of the present invention causes the main FET 100 to be switched on slowly and off rapidly, while it switches the sense FET 200 on rapidly and off slowly.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

For example, in place of the main FET and the sense FET other switching devices may be used.

As described above, the input-separated switching device and a driving circuit thereof according to the present invention not only maintains the ratio of the current flowing to the main FET to the current flowing to the sense FET, but also prevents a breakdown of the gate-separated MOS FET.

What is claimed is:

1. In an equivalent power source for supplying a source current, an input-separated switching device driving circuit comprising:

an input-separated switching device including a main switching device for switching a load current portion of the source current based on a first driving signal applied to a first driving signal input, and a sense switching device for switching another portion of the source current based on a second driving signal applied to a second driving signal input in order to check the intensity of the load current;

a current sensor for forming a sensing voltage to check the intensity of the load current using current flowing to the sense switching device, the current sensor having one terminal thereof connected to the current output of the sense switching device; and a current ratio compensator for adding the sensing voltage to the second driving signal input, the current ratio compensator having a first terminal connected to one terminal of the current sensor, and a second terminal connected to the second driving signal input.

2. The input-separated switching device driving circuit as claimed in claim 1, wherein the main switching device and the sense switching device are a main FET and a sense FET, respectively, wherein a drain of the main FET is connected to a drain of the sense FET, and wherein a gate and a source of the main FET are separated from a gate and a source of the sense FET, respectively.

3. The input-separated switching device driving circuit as claimed in claim 1, further comprising a switching device protector including:

a first Zener diode having a cathode connected to the first driving signal input, and an anode being grounded; and a second Zener diode having a cathode connected to a third terminal of the current ratio compensator, and an anode being grounded.

4. The input-separated switching device driving circuit as claimed in claim 1, wherein the current sensor includes a resistor having one terminal thereof connected to a current output of the sense switching device, and the other terminal thereof being grounded.

5. In an equivalent power source for supplying a source current, an input-separated switching device driving circuit comprising:

an input-separated switching device including a main switching device for switching a load current portion of the source current based on a first driving signal applied to a first driving signal input, and a sense switching device for switching another portion of the source current based on a second driving signal applied to a second driving signal input in order to check the intensity of the load current;

a current sensor for forming a sensing voltage to check intensity of the load current using current flowing to the sense switching device, the current sensor having one terminal thereof connected to a current output of the sense switching device; and a current ratio compensator for reducing a voltage applied to the first driving signal input by way of the sensing voltage, the current ratio compensator having a first terminal connected to one terminal of the current sensor, and a second terminal connected to the first driving signal input.

6. The input-separated switching device driving circuit as claimed in claim 5, wherein the main switching device and the sense switching device are a main FET and a sense FET, respectively, wherein a drain of the main FET is connected to a drain of the sense FET, and wherein a gate and a source of the main FET are separated from a gate and a source of the sense FET, respectively.

7. The input-separated switching device driving circuit as claimed in claim 5, further comprising a switching device protector including:

a third Zener diode having a cathode connected to a third terminal of the current ratio compensator, and an anode being grounded; and a fourth Zener diode having a cathode connected to the second driving signal input, and an anode being grounded.

8. The input-separated switching device driving circuit as claimed in claim 5, wherein the current sensor includes a resistor having one terminal thereof connected to a current output of the sense switching device, and another terminal thereof being grounded.

9. An input-separated switching device driving circuit comprising:

an input-separated switching device including a main switching device for switching a load current portion of a source current, and a sense switching device for switching another portion of the source current in order to check intensity of the load current;

a first delay circuit receiving a first control signal, and generating a delayed first control signal;

a main switch driver for switching on the main switching device based on a second control signal opposite to the first control signal in truth value, and switching off the main switching device with a delay based on the first control signal output from the first delay circuit;

a second delay circuit receiving the second control signal, and generating a delayed second control signal;

a sense switch driver for switching on the sense switching device with a delay based on the second control signal output from the second delay circuit, and switching off the sense switching device based on the first control signal; and a current sensor for forming a sensing voltage to check the intensity of the load current using current flowing to the sense switching device, the current sensor having one terminal thereof connected to a current output of the sense switching device.

10. The input-separated switching device driving circuit as claimed in claim 9, wherein the main switching device and the sense switching device are a main FET and a sense FET, respectively, wherein a drain of the main FET is connected to a drain of the sense FET, and wherein a gate and a source of the main FET are separated from a gate and a source of the sense FET, respectively.

11. The input-separated switching device driving circuit as claimed in claim 9, further comprising first and second switching device protectors including first and second Zener diodes, the first Zener diode having a cathode connected to the gate of the main switching device, the second Zener diode having a cathode connected to the gate of the sense switching device.

* * * * *